(12) United States Patent
Sawaki et al.

(10) Patent No.: US 6,844,572 B2
(45) Date of Patent: Jan. 18, 2005

(54) LIGHT EMITTING SEMICONDUCTOR DEVICE AND METHOD OF FABRICATING THE SAME

(75) Inventors: Nobuhiko Sawaki, Aichi (JP); Norikatsu Koide, Aichi (JP); Kensaku Yamamoto, Hiroshima (JP)

(73) Assignees: Sharp Kabushiki Kaisha, Osaka (JP); Nobuhiko Swaki, Nagoya (JP)

( * ) Notice: Subject to any disclaimer, the term of this patent is extended or adjusted under 35 U.S.C. 154(b) by 0 days.

(21) Appl. No.: 10/393,111

(22) Filed: Mar. 18, 2003

(65) Prior Publication Data

US 2003/0178702 A1 Sep. 25, 2003

(30) Foreign Application Priority Data

Mar. 19, 2002 (JP) .......................... 2002-075924
Mar. 11, 2003 (JP) .......................... 2003-064968

(51) Int. Cl.$^7$ .................... H01L 33/00; H01L 21/00; H01S 5/00
(52) U.S. Cl. .............. 257/94; 257/12; 257/13; 257/98; 257/103; 438/22; 438/24; 438/46; 372/45; 372/46; 372/48
(58) Field of Search ................ 257/12–13, 94, 257/98, 103, 89, 90; 438/22, 24, 28, 46, 47, 48; 372/45–46, 48

(56) References Cited

U.S. PATENT DOCUMENTS 5,909,036 A * 6/1999 Tanaka et al. ............... 257/94
6,265,733 B1 * 7/2001 Shimoyama et al. ......... 257/94
6,635,901 B2 * 10/2003 Sawaki et al. ............... 257/80
2002/0074561 A1 6/2002 Sawaki et al.
2003/0031219 A1 2/2003 Sawaki et al.

FOREIGN PATENT DOCUMENTS

| JP | 07183576 A | 7/1995 |
|----|------------|--------|
| JP | 08088407 A | 4/1996 |
| JP | 09199419 A | 7/1997 |
| JP | 11087773 A | 3/1999 |
| JP | 2002026387 A | 1/2002 |
| JP | 2002185041 A | 6/2002 |
| JP | 2002246646 A | 8/2002 |
| JP | 2002246697 A | 8/2002 |
| JP | 20038061 A | 1/2003 |

* cited by examiner

*Primary Examiner*—Donghee Kang
(74) *Attorney, Agent, or Firm*—Morrison & Foerster LLP

(57) ABSTRACT

A light emitting semiconductor device includes a silicon substrate and a compound semiconductor layer disposed on a main plane of the silicon substrate and represented by a general expression $In_xGa_yAl_zN$, wherein $x+y+z=1$, $0 \leq x \leq 1$, $0 \leq y \leq 1$, and $0 \leq z \leq 1$. The silicon substrate has a groove having an oblique plane corresponding to a plane inclined relative to the substrate's main plane by 62 degrees or a plane inclined relative to the inclined plane in any direction within three degrees, and on the oblique plane a plurality or quantum well layers different in thickness are stacked.

8 Claims, 15 Drawing Sheets

LIGHT EMITTING SEMICONDUCTOR DEVICE AND METHOD OF FABRICATING THE SAME

BACKGROUND OF THE INVENTION

1. Field of the Invention

The present invention relates to light emitting semiconductor devices employing nitride semiconductor and methods of fabricating the same.

2. Conventional Art

Using nitride semiconductor material of GaN, InN and AlN and a semiconductor of a mixture thereof, light emitting devices with $In_xGa_{1-x}N$ crystal as a light emitting layer on a sapphire substrate, GaN substrate, SiC substrate or silicon (111) substrate have been produced. Since the Si substrate is particularly superior than the other substrates by the advantage of providing those of a large area and constant quality at low cost, it is expected that a light emitting device can be produced at low cost by using an Si substrate. Furthermore, an attempt is also being made to prototype a light emitting semiconductor device using nitride semiconductor material formed of the above mixed crystal semiconductor.

When a nitride semiconductor device is fabricated on the sapphire substrate, SiC substrate, silicon (111) substrate as described above, a nitride semiconductor film is obtained typically with a hexagonal crystal's C plane as a growth surface.

With the C plane as a growth surface, however, polarization from anisotropy is readily applied to the c axis direction as a piezoelectric field as a hexagonal crystal is a uniaxial crystal. As such, when an active layer is stacked in the c axis direction and its plane is used, from the piezoelectric field electron and hole carriers are separated to opposite ends of a triangular potential, as shown in FIG. 1A, and accordingly the electron and hole carriers are hardly recombined.

Although in the active layer a well layer is increased in thickness to prevent emission from providing longer wavelength and reduce quantum effect, the piezoelectric field's effect that further separates electron and hole carriers (FIG. 1B) provides a reduced carrier recombination probability. As such, when a long-wavelength light emitting nitride semiconductor device is fabricated, changing the composition of a well layer of mixed crystal semiconductor in an active layer to control a bandgap is the only approach.

For example in an experiment conducted by the present inventors when a nitride based semiconductor material with a C plane as a main plane was used to fabricate a light emitting semiconductor device on a sapphire substrate the light emitting device with an active layer having a thickness of 3 nm provided maximum luminance and the luminance is approximately halved for a thickness ranging from 2 to 4.5 nm.

As such, when a nitride based, light emitting semiconductor device is used to fabricate a light emitting device allowing multicolor emission with a single chip, a light emitting layer different in bandgap is used to form a multilayer structure or an integration, as disclosed in Japanese Patent Laying-Open Nos. 7-183576, 8-88407 and 11-87773. In other words, to fabricate a light emitting diode allowing multicolor emission with a single chip, changing a composition of a well layer of mixed crystal semiconductor to provide an appropriately adjusted bandgap is the only approach.

SUMMARY OF THE INVENTION

The present invention has been made to overcome the above disadvantage and contemplates a light emitting nitride based semiconductor device allowing an emission wavelength to be controlled without reduced electron hole pair carrier recombination probabilities and a method of fabricating the same.

The present light emitting semiconductor device in one aspect is comprised of a substrate and a compound semiconductor layer disposed on the substrate and represented by a general expression $In_xGa_yAl_zN$, wherein $x+y+z=1$, $0 \leq x \leq 1$, $0 \leq y \leq 1$, and $0 \leq z \leq 1$. The substrate has a groove having an oblique plane corresponding to one of a plane inclined relative to a main plane of the substrate by 62 degrees and a plane inclined relative to the inclined plane in any direction within three degrees. The compound semiconductor layer includes a base layer disposed on the oblique plane and an active layer disposed on the base layer. The active layer is formed of a well layer and a barrier layer alternately stacked. The well layer has a thickness of 2 to 10 nm, preferably 2 to 8 nm, more preferably 4.5 to 8.0 nm.

The present light emitting semiconductor device in one aspect is comprised of a substrate and a compound semiconductor layer disposed on the substrate and represented by a general expression $In_xGa_yAl_zN$, wherein $x+y+z=1$, $0 \leq x \leq 1$, $0 \leq y \leq 1$, and $1 \leq z \leq 1$. The substrate has a groove having an oblique plane corresponding to one of a plane inclined relative to a main plane of the substrate by 62 degrees and a plane inclined relative to the inclined plane in any direction within three degrees. The compound semiconductor layer includes a base layer disposed on the oblique plane and an active layer disposed on the base layer. The active layer is stacked in a direction intersecting a direction of a c axis of the base layer. In other words, the compound semiconductor layer is provided to reduce an electric field attributed to a distortion applied to a c axis of the compound semiconductor layer.

The active layer may have a (1-101) plane as an orientation. The active layer may have more than one well layer different in thickness. The active layer may have a plurality of well layers providing emission in red, blue and green to allow emission in white with a single chip.

The substrate is preferably a silicon substrate. Furthermore, on the oblique plane more than one the compound semiconductor layer may be integrated, the compound semiconductor layer may individually include an active layer having a well layer providing emission of a plurality of emission wavelengths, and the compound semiconductor layer may underlie a transparent film. Preferably the transparent film selectively transmits light emitted by the well layer and formed of spectra. More than one the groove may be provided in the substrate and compound semiconductor layers formed on oblique planes of more than one groove, respectively, may be combined together as crystal growth proceeds.

For example, a substrate rotated from the silicon substrate's (001) plane about a [01-1] axis by 7.3 degrees or a plane inclined relative to the plane in any direction within three degrees can selectively be etched to form a groove having a (111) facet in a relation of 62 degrees relative to the substrate's main plane. On this oblique plane a nitride based semiconductor film can further be grown epitaxially to obtain a film for example with a GaN based semiconductor's (1-101) facet of as a growth plane.

When this (1-101) facet is used as a growth plane (a main plane) to provide a light emitting, nitride based semiconductor device, a c axis significantly having a piezoelectric field would be inclined and this electric field introduced by an interface of well and barrier layers in the active layer can be reduced. As such, if the well layer is increased in thickness, it can be varied in thickness without reduced electron hole pair carrier recombination probabilities within a range no more than a critical film thickness resulting from each layer's lattice constant difference, and emission wavelength can be controlled.

The present invention provides a method of fabricating a light emitting semiconductor device, including the steps of: providing a substrate with a groove having an oblique plane; providing on the oblique plane a compound semiconductor layer represented by a general expression $In_xGa_yAl_zN$, wherein $x+y+z=1$, $0 \leq x \leq 1$, $0 \leq y \leq 1$, and $0 \leq z \leq 1$, and having as a growth plane a (1-101) facet inclined relative to the oblique plane by 62 degrees; and stacking on the (1-101) facet a plurality of well layers of 2 to 10 nm in thickness and a barrier layer alternately to form an active layer.

Fabricating on the (1-101) facet a light emitting semiconductor device including an active layer having a well layer increased in thickness can provide a nitride-based, light emitting semiconductor device providing high luminance and emitting light of long wavelength, and stacking for a single chip well layers different in thickness can help to fabricate a light emitting device including an active layer allowing multicolor emission.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

The present invention will now be described in embodiments.

First Embodiment

Figure 1A:
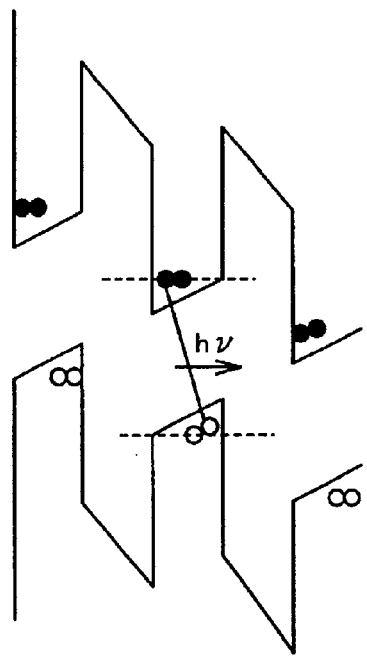
FIGS. 1A–1C show a concept of an emission mechanism.
Figure 1B:
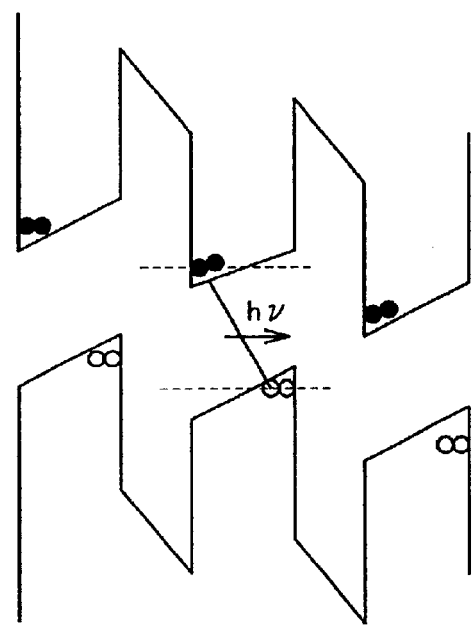
Figure 1C:
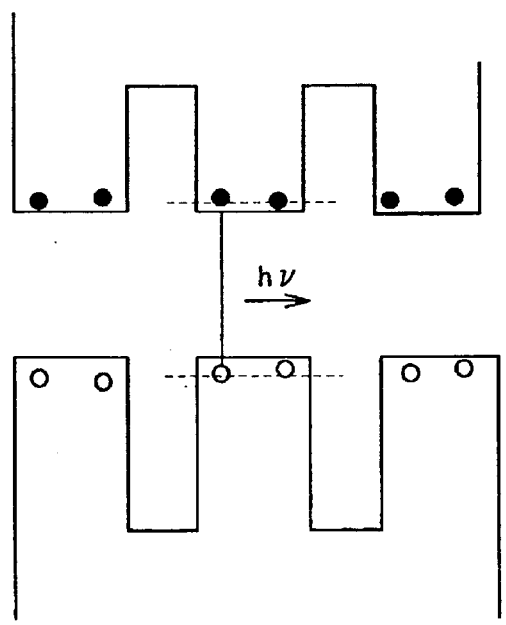
Figure 2:
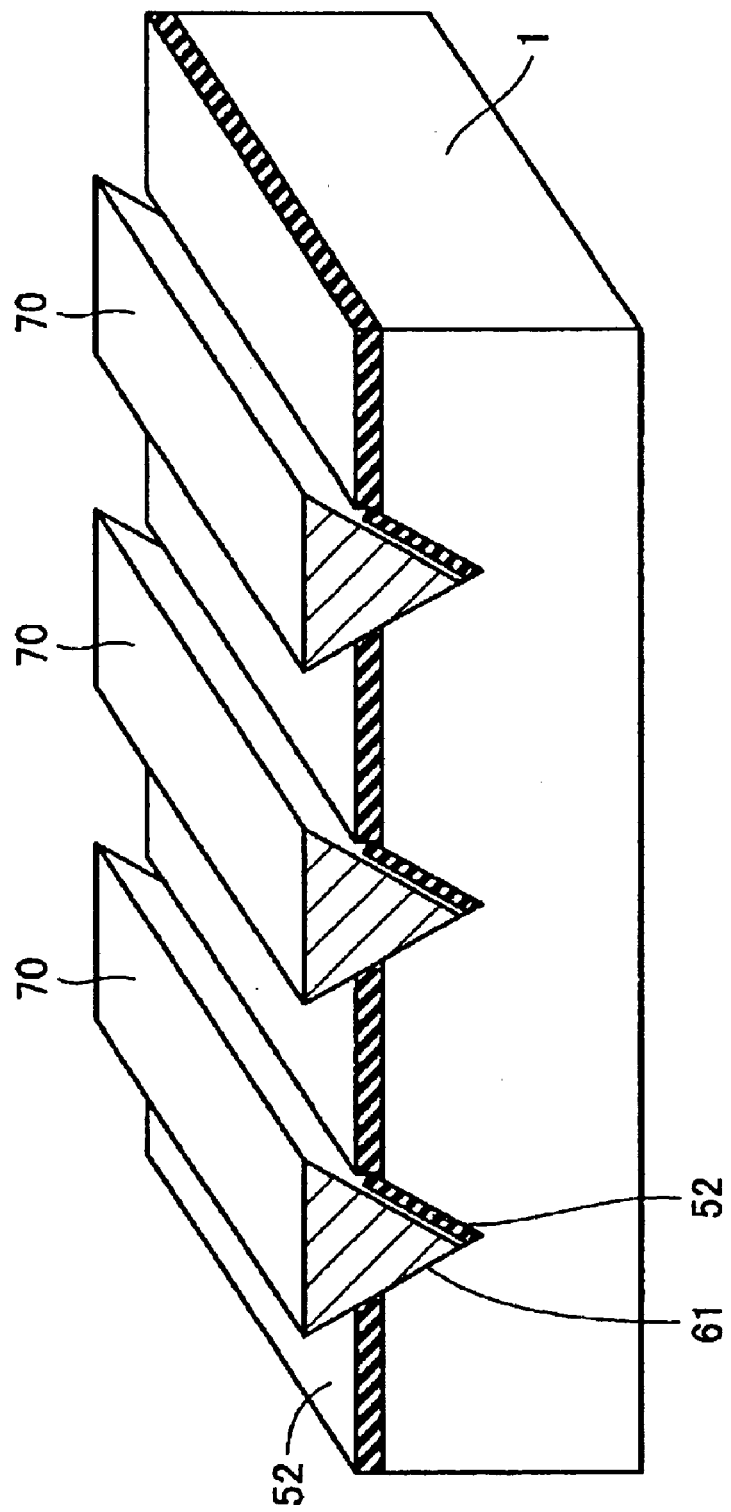
FIG. 2 shows a concept of a nitride semiconductor film's (1-101) facet growth.
Figure 10:
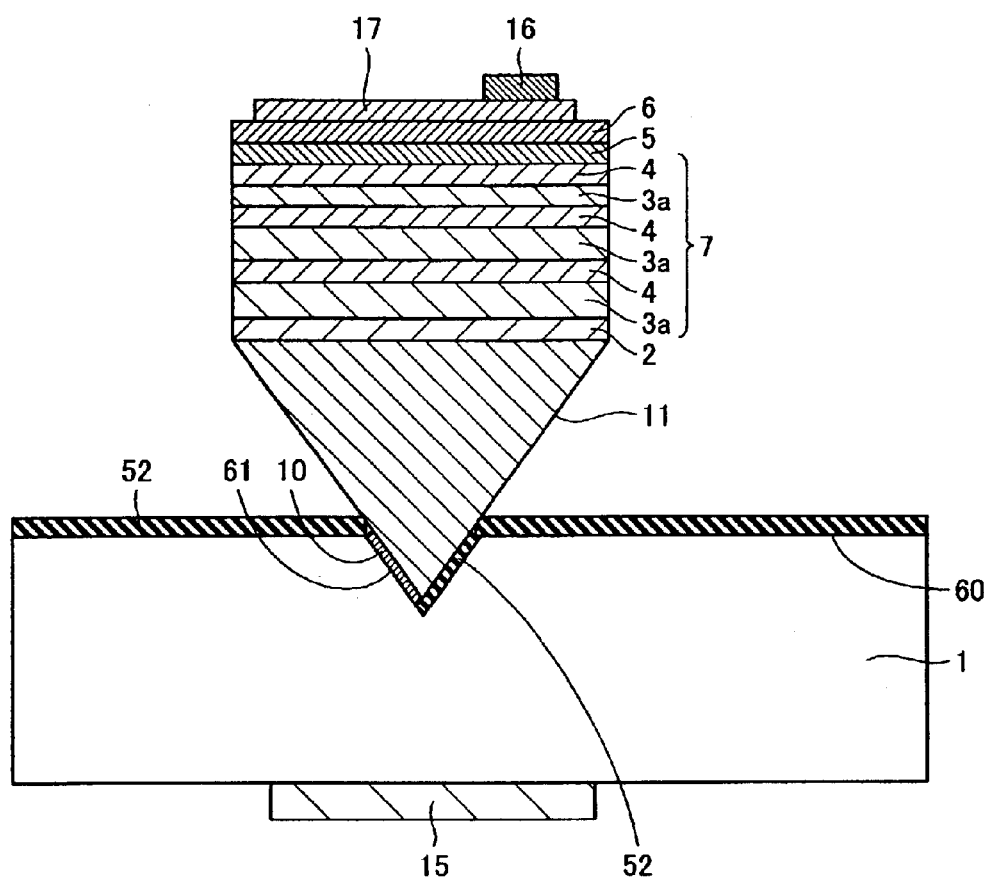
FIG. 10 is a cross section of a structure of a light emitting semiconductor device of a first embodiment.

FIG. 2 represents a concept for forming a (1-101) facet 70 of a semiconductor nitride film of the present embodiment, and FIG. 10 is a schematic cross section of a structure of a light emitting nitride semiconductor device fabricated on the (1-101) facet 70 thus formed.

The present embodiment provides a light emitting nitride semiconductor device, as shown in FIG. 10, including a silicon substrate 1 and a compound semiconductor layer provided on a main plane of silicon substrate 1. Silicon substrate 1 has a main plane 60 inclined relative to a (001) plane by 7.3° degrees in a [0-1-1] direction, i.e., rotated from the (001) plane about a [01-1] axis by 7.3°, or a main plane inclined relative to main plane 60 in any direction within three degrees. Using silicon substrate 1 allows a compound semiconductor film (e.g., GaN film) having an extremely flat (1-101) plane as a growth plane and represented by a general expression $In_xGa_yAl_zN$, wherein $x+y+z=1$, $0 \leq x \leq 1$, $0 \leq y \leq \leq 1$, and $0 \leq z \leq 1$.

If reducing a piezoelectric field is a main issue, however, a substrate other than silicon substrate 1 can also be used. For example, a similar result can be obtained by etching a substrate to provide an oblique plane helping to grow a c axis of nitride based semiconductor film, growing a nitride based semiconductor film having as a growth plane a (1-101) plane inclined relative to the oblique plane by 62 degrees, and using the (1-101) plane as a main plane. As such, GaAs, GaP, InP, SiC and the like substrates can also be used.

Silicon substrate 1 has a main plane selectively provided with a mask 52 formed of silicon oxide film, silicon nitride film or dielectric multilayer reflection film. Silicon substrate 1 at a portion free of mask 52 has a groove having an oblique plane corresponding to a (111) facet corresponding to a plane inclined relative to the main plane of silicon substrate 1 by 62 degrees, or a plane inclined relative to the facet in any direction within 3 degrees On the groove's (111) facet a crystal in the form of a triangular prism 11 of GaInN is formed with an intermediate n-AlGaIN layer 10 posed therebetween and on crystal 11 a first clad layer 2, and a quantum well layer 3a and a barrier layer 4 are stacked (to provide an active layer). The active layer is stacked in a direction intersecting a direction of a c axis of a base layer. In other words, the compound semiconductor layer is formed to reduce an electric field attributed to a distortion added to a c axis of the compound semiconductor layer.

On the structure formed of stacked layers a carrier block p-AlGaInN layer 5 and a magnesium doped, p second clad layer 6 are provided. Furthermore, silicon substrate 1 has a lower surface provided with an electrode 15, and the second clad layer 6 has an upper surface provided with a transparent electrode 17, and transparent electrode 17 has an upper surface partially provided with a bonding electrode 16.

The second clad layer 6 provides large resistance and introducing a current, or a hole, to one end of the second clad layer 6 directly from bonding electrode 16 alone may not allow a current density uniform throughout the light emitting layer of $In_xGa_{1-x}N$. Accordingly, transparent electrode 17 in a thin film is provided between bonding electrode 2 and clad layer 6 to substantially entirely cover a surface of the second clad layer 6. More emission can be output.

Note that transparent electrode 17 connected to the second clad layer of p-type GaN 6 may be of any metal having a thickness of no more than 20 nm, desirably including any of Ta, Co, Rh, Ni, Pd, Pt, Cu, Ag and Au.

Furthermore, electrode 15 provided on a back surface of n silicon substrate 1 may be formed of any metal, desirably including any of Al, Ti, Zr, Hf, V and Nb.

Figure 11:
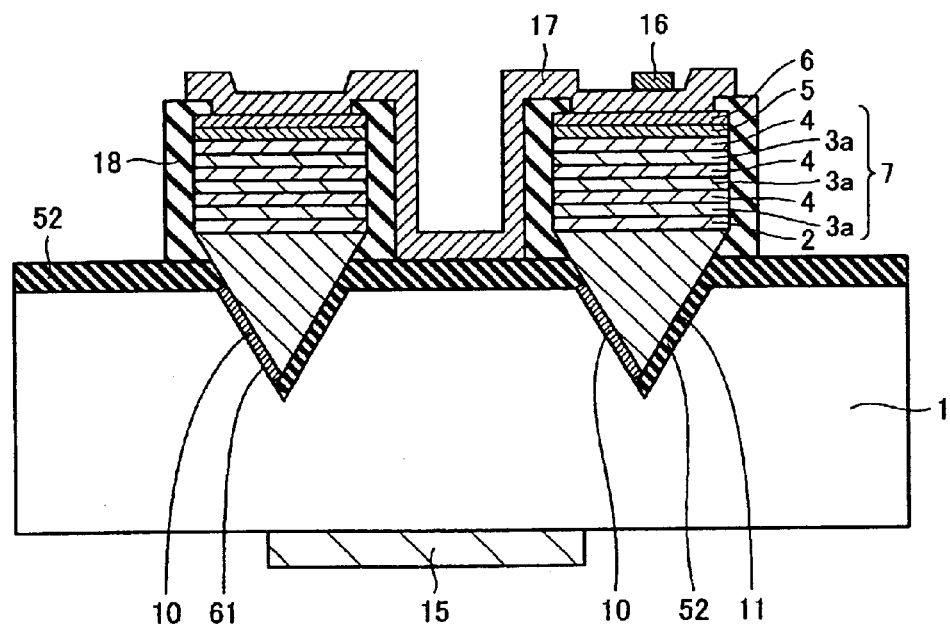
FIG. 11 is a cross section of an exemplary variation of the structure of the light emitting semiconductor device of the first embodiment.
Figure 17:
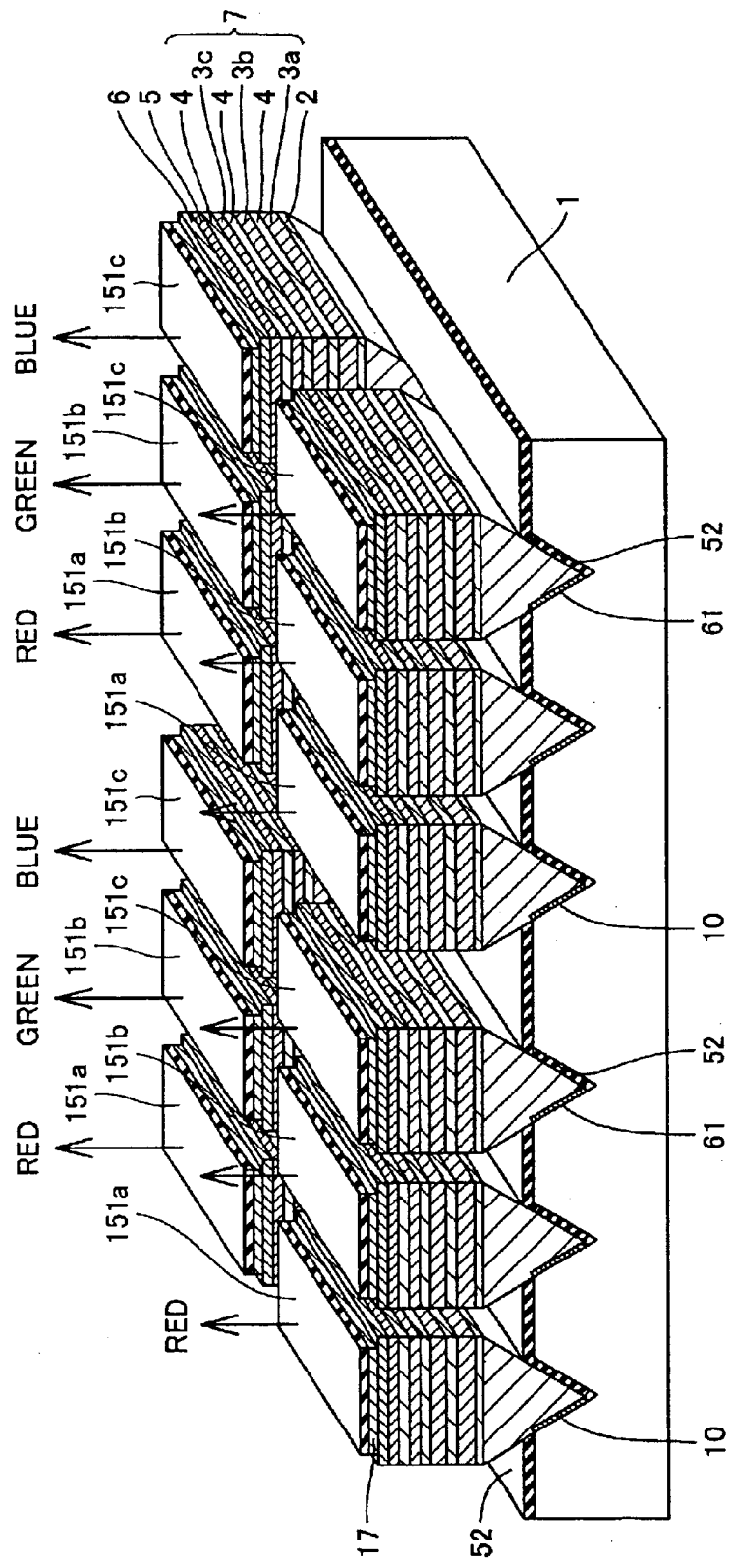
FIG. 17 is a perspective view of a display integrating the light emitting semiconductor device of the fourth embodiment.

Note that while the FIG. 10 example shows that on a facet a single semiconductor device is fabricated, a plurality of such semiconductor devices may be arranged and a p-side transparent electrode 17 may then be formed in a film, as shown in FIG. 11. It should be noted in this example, however, that the provision of transparent electrode 17 may cause short circuit of a side surface of the crystal in the form of a triangular prism 11 corresponding thereto. Accordingly, as shown in FIG. 17, before transparent electrode 17 is provided, sputtering, photolithography and etching are employed to provide an insulation film 18 formed of silicon oxide film, silicon nitride film or the like and having a thickness of 100 nm.

In the present embodiment the light emitting layer of $In_xGa_{1-x}N$ can have its component x and thickness varied to allow interband emission wavelength to vary from ultraviolet to red.

In a conventional example a piezoelectric field's effect allows a highest recombination probability as well as a high emission efficiency when a well layer has a thickness of 3 nm, whereas in the present embodiment, increasing the well layer in thickness does not impair emission efficiency, and quantum effect reducing with thickness results in an increased wavelength and the active layer's thickness and solid phase composition are not uniquely determined.

Accordingly in the present embodiment will be described by way of example a relationship between composition and thickness for a well layer having a thickness of 3 nm and providing blue emission at 460 nm when the $In_xGa_{1-x}N$ active layer's solid phase composition has a value X=0.18.

Note that in the present specification a nitride semiconductor is a compound semiconductor formed mainly of a group-III element and the element N and including $Al_xIn_yGa_{1-x-y}N$ ($0 \leq x, y \leq 1$) as well as a crystal thereof with the group-III element partially (no more than approximately 20%) substituted with B, Al or other similar element, a crystal thereof with N partially (no more than approximately 10%) substituted with As, P, Sb or other similar element, and the like.

Hereinafter a method of fabricating the light emitting device of the present embodiment will be described with reference to FIGS. 3–9.

Figure 3:
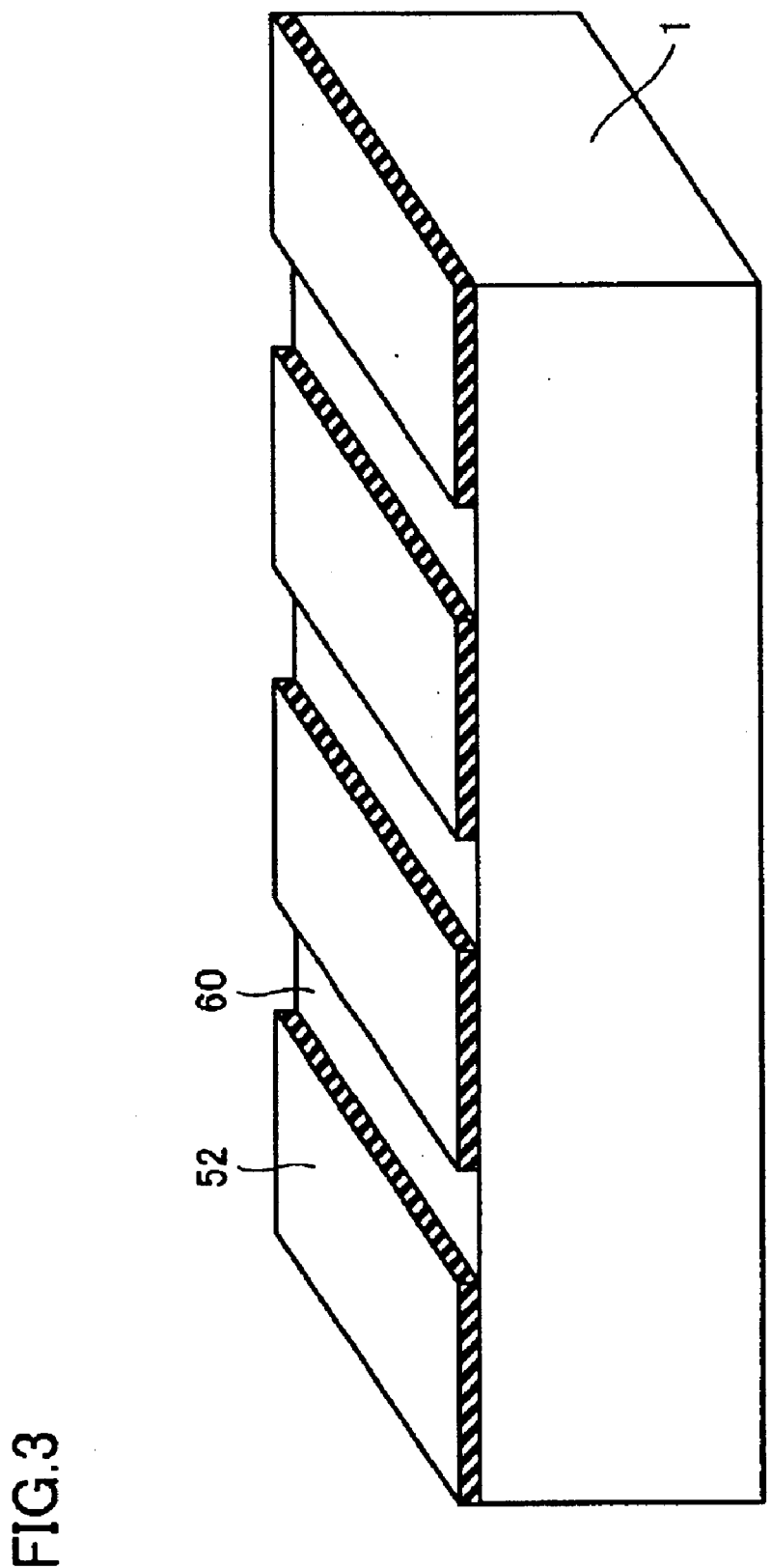
FIGS. 3–8 perspectively illustrate first to sixth steps of a process for fabricating a light emitting device of the present invention.

Initially silicon substrate 1 is washed and on main plane 60 thereof sputtering or chemical vapor deposition (CVD) is employed to deposit mask 52 for example of silicon oxide film to have a thickness of 100 nm, as shown in FIG. 3.

Silicon substrate 1 adsorbs light of blue, green, red and other similar, visible range. Accordingly in the light emitting semiconductor device of the first embodiment mask 52 is formed of dielectric multilayer reflection film to output light more efficiently. This allows increased emission intensity when it is sealed in a lamp.

For example in fabricating a blue light emitting device with 460 nm corresponding to a center frequency, combining three pairs of $SiO_2$ (79 nm)/$ZrO_2$ (55 nm) with mask 52 allowed light to be output more efficiently.

Figure 4:
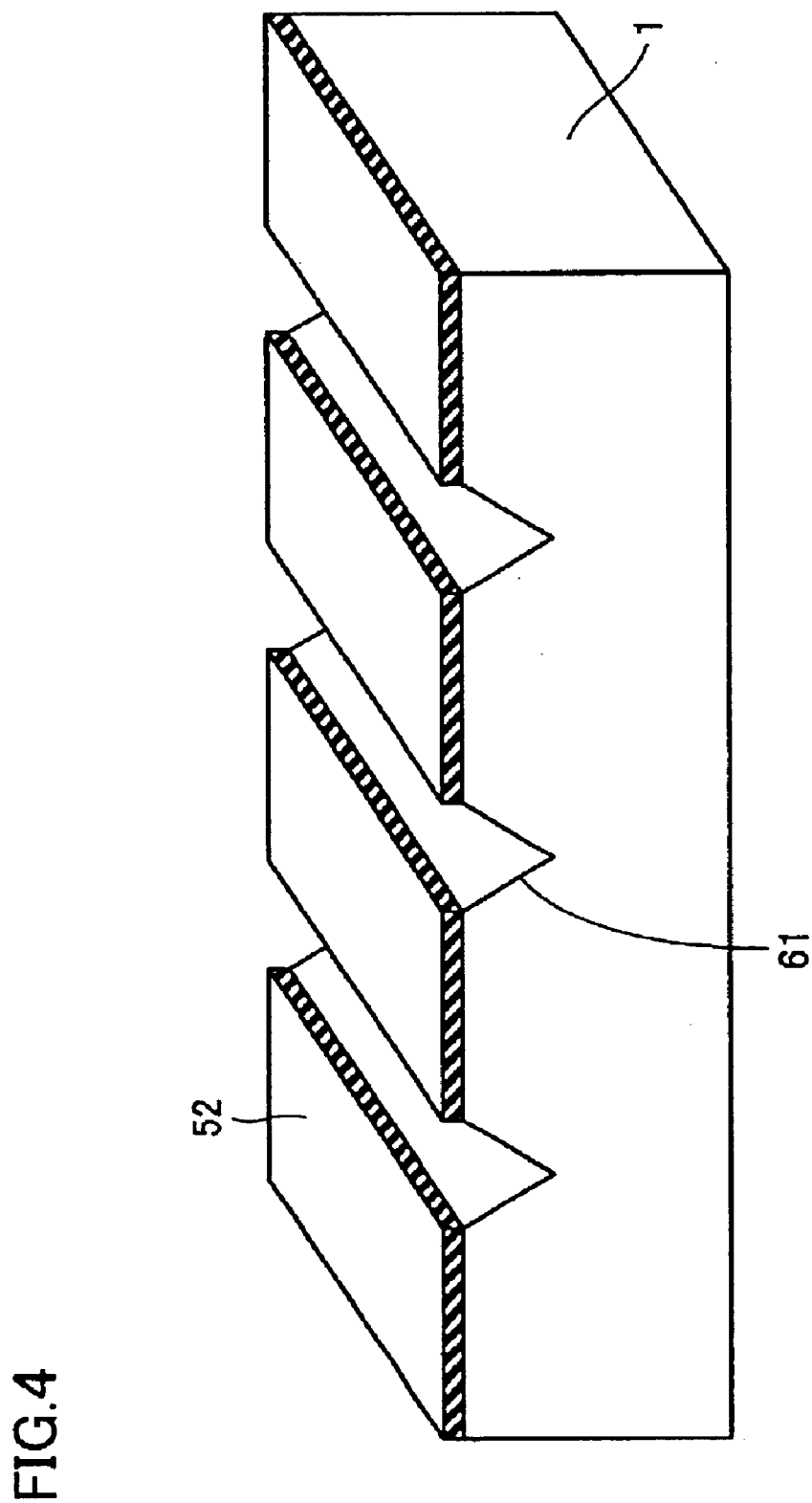

Subsequently, photolithography and etching are employed to partially remove mask 52 to form the mask in stripes, as shown in FIG. 3. Furthermore, silicon substrate 1 is etched using an alkaline etchant formed of KOH or an etchant formed of ethylenediamine, pyrocatechol and water mixed together in a solution, as shown in FIG. 4, to provide silicon substrate 1 with a groove selectively having a silicon (111) facet 61.

This groove is a groove in the form of a stripe extending in a silicon [01-1] direction. Furthermore, the (111) facet 61 is formed as the silicon substrate 1 main plane 60 is set as the above predetermined orientation, and relative thereto the facet has a relationship of 62 degrees. This facet can be readily formed by appropriately adjusting a conventionally known etchant in temperature and adjusting a rate to etch the substrate.

It has been found from experiments conducted by the present inventors, however, that when this growth methodology is employed, dislocation is introduced in a vicinity of an interface of silicon substrate 1 and the nitride semiconductor film and extends laterally (in a direction parallel to the (111) facet 61). The dislocation penetrates the nitride semiconductor film and when an active layer is stacked thereon a portion partially with low emission efficiency was observed.

Figure 15:
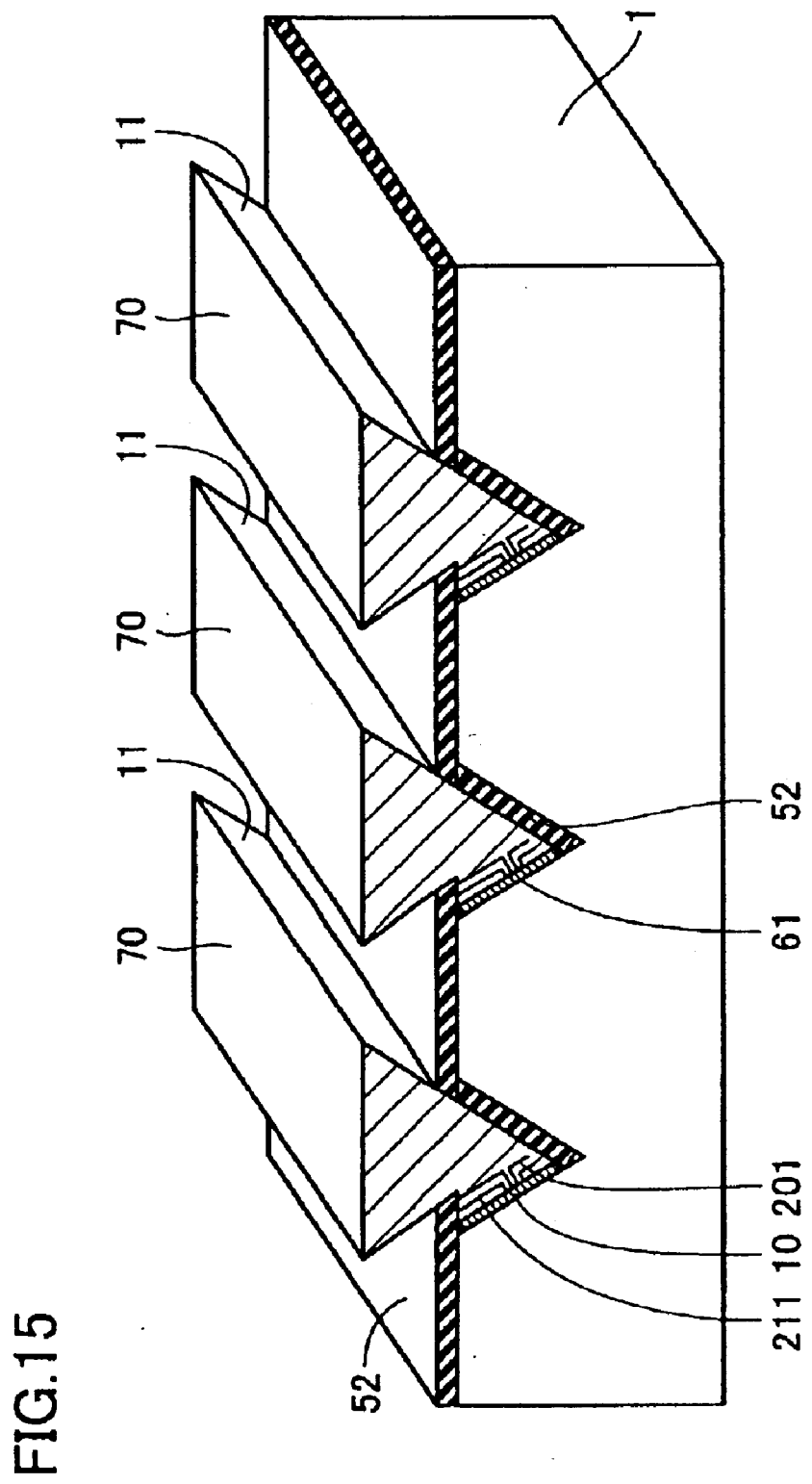
FIG. 15 illustrates a concept representing a dislocation introduced in a nitride semiconductor film's (1-101) facet growth.

To avoid this, when the substrate is etched to provide the silicon (111) facet 61 it is etched deeper than an end of mask 52 by the thickness of a region in which dislocation extends. Thus etching silicon substrate 1 deep (or providing an overetched portion 211) can prevent a dislocation 201 that bends in a vicinity of the substrate's interface and thus extends from penetrating the nitride semiconductor film (the crystal in the form of a triangular prism 11), as shown in FIG. 15.

Silicon substrate 1 having the groove formed as described above is introduced into a metal-organic chemical vapor deposition (MOCVD) apparatus and cleaned in an ambient of hydrogen ($H_2$) at a high temperature of approximately 1100° C.

Figure 5:
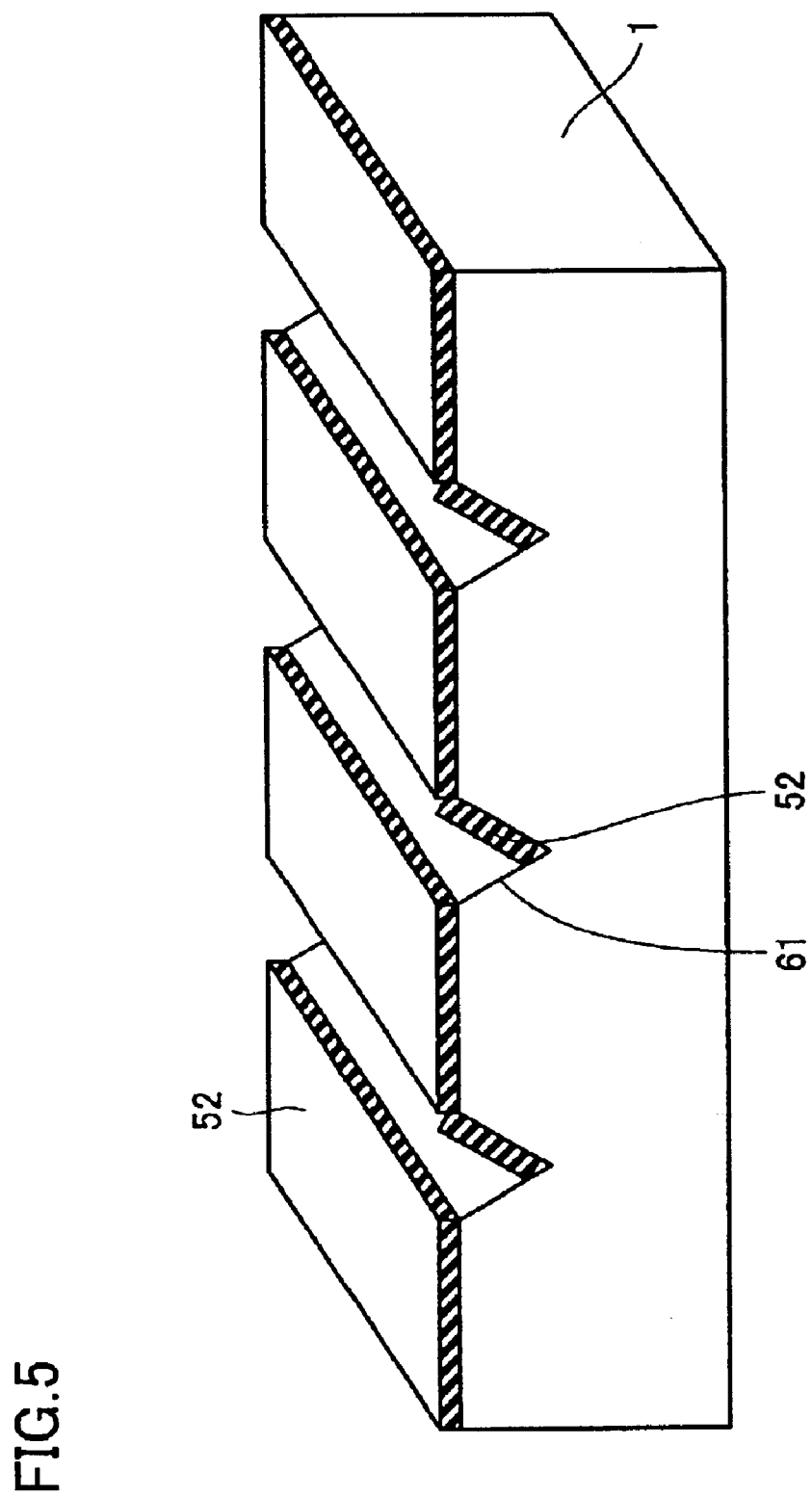

Then, as shown in FIG. 5, crystal growth is effected from a predetermined (111) facet 61 preferentially. More specifically, the groove is provided on a surface thereof selectively with mask 52 for example of silicon nitride film, silicon oxide film, dielectric multilayer reflection film, or the like, and has the remaining surface region exposed. In other words, a material which suppresses growth of nitride semiconductor is used to selectively cover the groove's surface.

Note that if the substrate is insufficiently overetched, the substrate in FIG. 5 may again be overetched with alkaline etchant to have an appropriately adjusted, overetched depth.

Then, at the temperature of 800° C., $NH_3$, trimethyl aluminium (TMA), trimethyl indium (TMI) and $SiH_4$ gas are introduced at 5 l/min., 10 μmol/min., 17 μmol/min., and 0.1 μmol/min., respectively, while introducing $N_2$ at 10 l/min. as carrier gas, to form a silicon doped, $Al_{0.85}In_{0.15}N$ intermediate layer 10 of approximately 10 nm in thickness.

Figure 6:
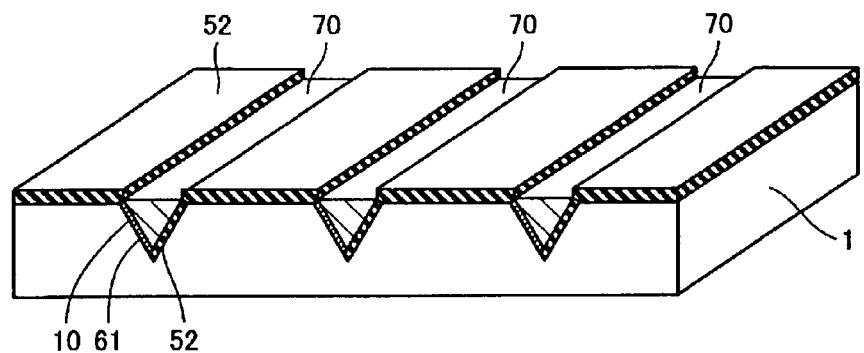
Figure 7:
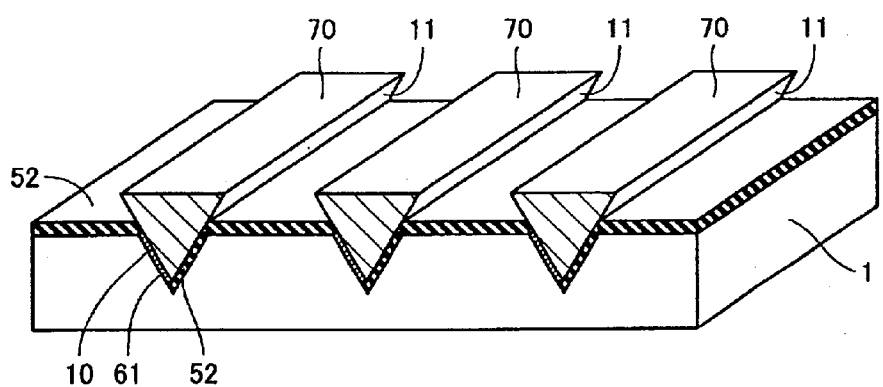
Figure 8:
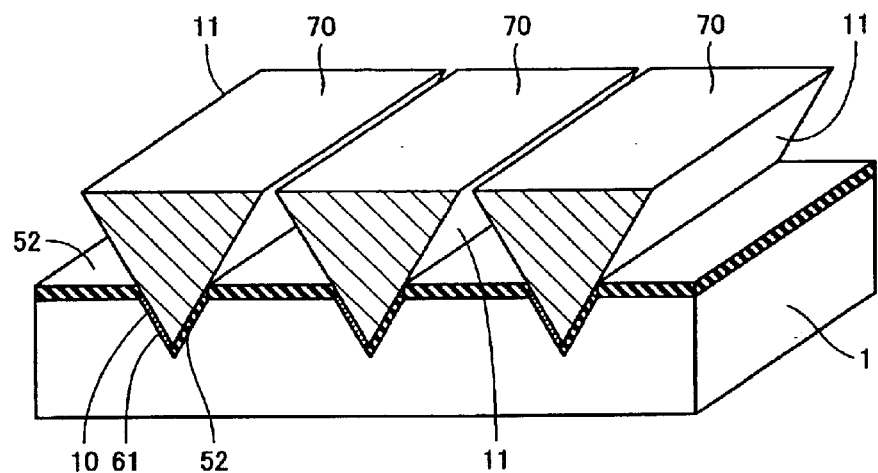

Then, as shown in FIGS. 6–8, crystal growth proceeds such that an axis perpendicular to facet 61 forming an angle of 62 degrees relative to the main plane of silicon substrate 1 is the nitride semiconductor film's c axis, and furthermore the nitride semiconductor film's (1-101) facet 70 is formed in a plane. More specifically, at 800° C., supplying TMA is stopped, and trimethyl gallium (TMG), TMI, and $SiH_4$ (silane) gas are introduced at approximately 20 μmol/min., 100 μmol/min., and 0.05 μmol/min., respectively, to grow the crystal in the form of a triangular prism 11 formed of silicon-doped $Ga_{0.92}In_{0.08}N$ and having a thickness of approximately two microns.

Following deposition of an intermediate layer 10 of AlInN, the growth temperature for the crystal in the form of a triangular prism 11 can be increased to result in an GaN film. Alternatively, by using crystal 11 that includes In and does not include Al, growth at low temperature is allowed and generation of cracks can be suppressed.

Figure 9:
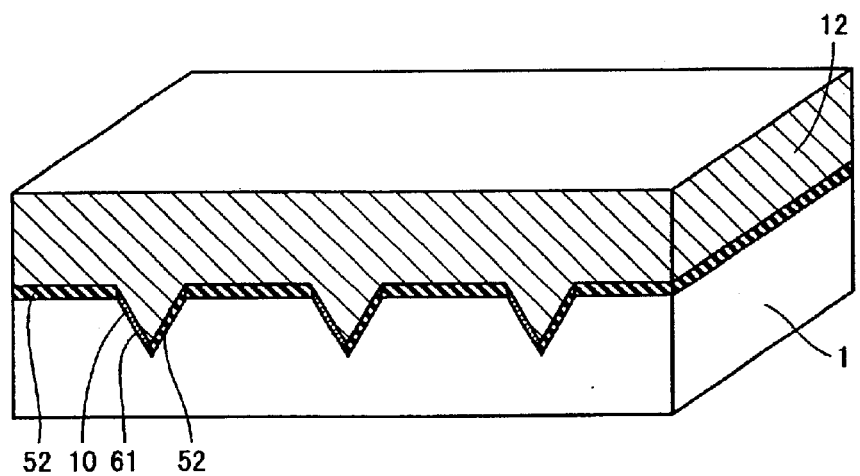
FIG. 9 is a perspective view of a silicon substrate with a successive nitride semiconductor film provided thereon.

Note that while the crystal in the form of a triangular prism 11 may have the (1-101) facet 70 with a light emitting device structure formed thereon, the nitride semiconductor film may continuously be grown and, as shown in FIG. 9, a continuous film 12 may be formed and a light emitting semiconductor device may be fabricated thereon. Continuous film 12 also has an upper surface serving as a (1-101) facet.

Then, as shown in FIG. 10, introducing TMI is stopped to grow the first clad layer 2 of n-GaN to have a thickness of 200 nm. Using as the first clad layer 2 a semiconductor layer which contains Al and does not contain GaInN allowed low temperature growth and provided less cracks.

Then, supply of TMA, TMI and TMG is stopped. The temperature of the substrate is lowered to 700° C. Trimethyl indium (TMI) that is the indium material is introduced at 5.2 μmol/min., and TMG is introduced at 2.8 μmol/min., whereby a quantum well layer 3a of $In_{0.18}Ga_{0.82}N$ emitting light in a range corresponding to yellow color is grown to the thickness of 8 nm. Then, the temperature is raised again up to 850° C., and TMG is introduced at 14 μmol/min. to grow a barrier layer 4 of GaN.

Then the substrate is cooled to 760° C. and a similar quantum well layer 3a is grown. Quantum well layer 3a and barrier layer 4 are thus repeatedly grown to grow an active layer 7 formed of a multi quantum well (MQW) formed of three pairs and providing emission at a wavelength corresponding to blue color.

Following the completion of the growth of active layer 7, TMG, TMA, TMI, and biscyclo pentadienyl magnesium ($Cp_2Mg$) which is a p type doping source gas are introduced at 11 μmol/min., 1.1 μmol/min., 40 μmol/min. and 10 nmol/min., respectively, to grow a p type carrier block layer 5 of $Al_{0.20}Ga_{0.75}In_{0.05}N$ to a thickness of 50 nm at a temperature identical to that of the last barrier layer 4. At the end of the growth of carrier block layer 5, supply of TMA is stopped, and a p type second clad layer 6 of $Ga_{0.9}In_{0.1}N$ is grown to a thickness of 100 nm at the same growth temperature. This completes the growth of the light emitting device structure.

When the growth of the light emitting device structure ends, supply of TMG, TMI and $Cp_2Mg$ is stopped and the temperature is lowered to room temperature. Then the wafer is output from the MOCVD apparatus. Then on an upper surface of the second clad layer 6 formed of a p-type $Ga_{0.9}In_{0.1}N$ layer of each semiconductor device a transparent electrode 17 is provided and on a portion thereof a bonding electrode 16 is provided and on a lower surface of silicon substrate 1 an electrode 15 is provided and a dicing apparatus is further employed to divide the intermediate product into 300 μm×300 μm to complete the light emitting device of the present embodiment.

Table 1 shows how the light emitting device varies in luminance for different In contents of $Ga_{1-x}In_xN$ and different thicknesses of the well layer.

TABLE 1

| Composition | | 2.0 nm | 3.0 nm | 4.5 nm | 10.0 nm |
|---|---|---|---|---|---|
| $In_{0.18}Ga_{0.82}N$ | Conventional (c plane) | ○ | ⊚ | ○ | X |
|  | facet | ○ | ⊚ | ⊚ | ○ |
| $In_{0.25}Ga_{0.75}N$ | Conventional (c plane) | ○ | ○ | X | X |
|  | facet | ○ | ⊚ | ○ | Δ |
| $In_{0.3}Ga_{0.7}N$ | Conventional (c plane) | ○ | X | X | X |
|  | facet | ○ | ○ | ○ | X |

⊚: bright
○: somewhat bright
Δ: dark
X: significantly dark

As shown in Table 1, it can be understood that when a well layer of active layer 7 conventionally grown on a c plane has a thickness of 2 nm to 4.5 nm more than a predetermined level of luminance is obtained, whereas using the substrate (or facet) of the present embodiment allows more than the predetermined level of luminance for a thickness of a wide range of 2.0 to 10.0 nm of the well layer. The well layer has a thickness preferably of 2.0 to 8.0 nm, more preferably 4.5 nm to 8.0 nm. Increasing the well layer in thickness, as described above, can provide a light emitting semiconductor device emitting light highly efficiently at longer wavelength.

Note that when active layer 7 includes a well layer increased in thickness to no less than 10.0 nm a distortion resulting from a lattice constant difference in active layer 7 is increased and dislocation is accordingly increased, and this would contribute to impaired emission efficiency. As such, forming the well layer to have a thickness of no more than 8 nm would be preferable.

Adopting a structure having active layer 7 with a thick well layer stacked can not only simply adjust a bandgap alone but also allow a light emitting device capable of emission at longer wavelength to be fabricated more readily than a light emitting semiconductor device employing a C plane as a main plane on sapphire. Furthermore, it is less affected by piezoelectric field so that if a current injected is varied the device can still present multicolor emission with less variation in color.

Second Embodiment

Figure 12:
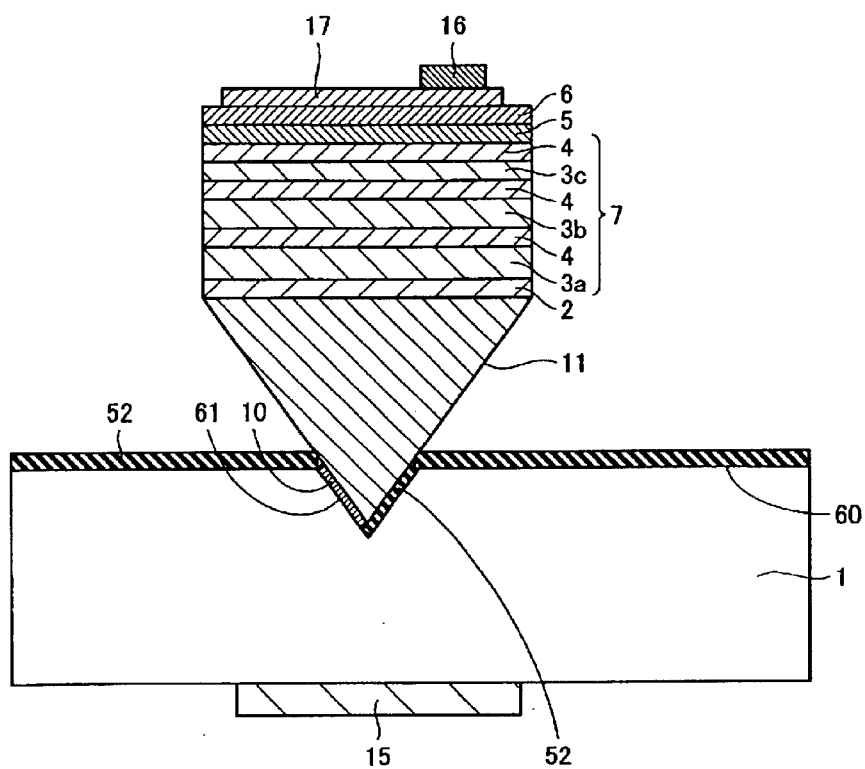
FIG. 12 is a cross section of a structure of a light emitting semiconductor device of a second embodiment.

The present invention in a second embodiment will be described. FIG. 12 is a schematic cross section of a structure of a light emitting nitride semiconductor device in the second embodiment.

As shown in FIG. 12, the light emitting device of the present embodiment differs from that of the first embodiment in the structure of active layer 7. More specifically, in the present embodiment, a quantum well layer 3a formed of $In_{0.25}Ga_{0.75}N$ and having a thickness of 80 nm, a well layer 3b formed of $In_{0.18}Ga_{0.82}N$ and having a thickness of 4.5 nm and a well layer 3c formed of $In_{0.18}Ga_{0.82}N$ and having a thickness of 3 nm are provided. The remainder of the structure is substantially the same as that described in the first embodiment.

A structure having active layer 7 with quantum well layers 3a, 3b, 3c different in thickness and successively stacked as described above can not only adjust a bandgap alone but also help to fabricate a light emitting device allowing multicolor emission with a single chip.

Figure 13:
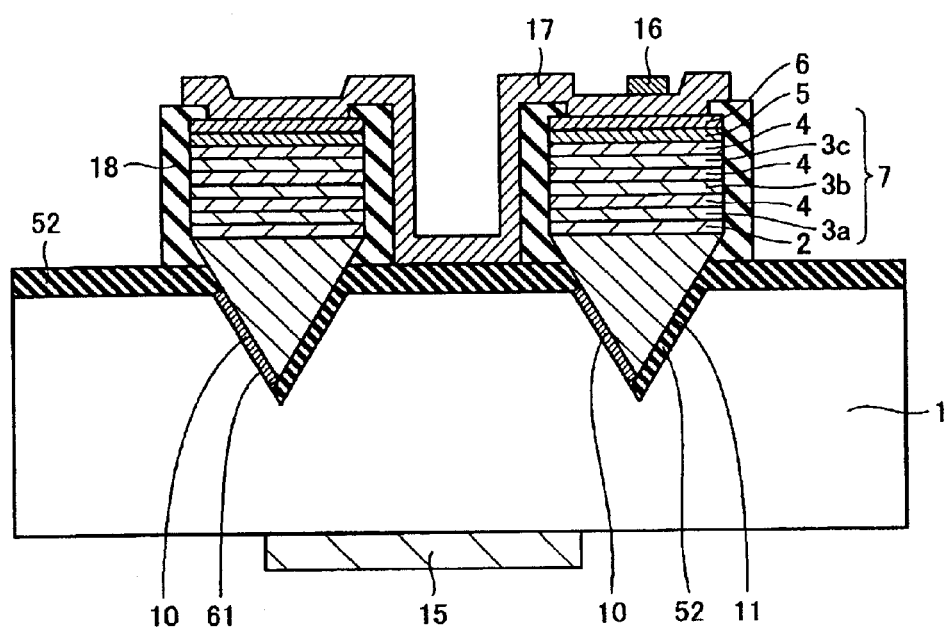
FIG. 13 is a cross section of an exemplary variation of the structure of the light emitting semiconductor device of the second embodiment.

Note that as shown in FIG. 13, a plurality of semiconductor devices may be arranged and a p-side transparent electrode 17 may then be formed in a film to extend thereon. It should be noted, however, that the provision of transparent electrode 17 may cause short circuit of a side surface of the crystal in the form of a triangular prism 11 corresponding thereto. Accordingly, as shown in FIG. 13, before transparent electrode 17 is provided, sputtering, photolithography and etching are employed to provide an insulation film 18 formed of silicon oxide film, silicon nitride film or the like and having a thickness of 100 nm.

A method of fabricating the light emitting device of the second embodiment will now be described.

Following a process similar to that of the first embodiment, a crystal in the form of a triangular prism 11 is grown, as shown in FIG. 8, and on a (1-101) facet 70 thereof a light emitting device structure is successively provided. Note that, as shown in FIG. 9, a semiconductor light emitting device may overlie continuous film 12.

A technique similar to that described in the first embodiment is employed to provide the first clad layer 2 on the (1-101) facet 70 of the crystal in the form of a triangular prism 11. Introducing TMA, TMI, TMG is then stopped and the substrate is cooled to 700° C., and trymethylindium (TMI) served as a source indium material and TMG are introduced at 5.2 (μmol/min.) and 2.8 (μmol/min.), respectively, to grow quantum well layer 3a formed of $In_{0.25}Ga_{0.75}N$, having a thickness of 8 nm and emitting light in a range corresponding to red color. Then again the substrate is heated to 850° C. and TMG is introduced at 14 μmol/min. to grow barrier layer 4 of GaN.

The substrate then is cooled to 760° C., and trymethylindium (TMI) served as a source indium material and TMG are introduced at 6.5 (μmol/min.) and 2.8 (μmol/min.), respectively, to grow quantum well layer 3c formed of $In_{0.18}Ga_{0.82}N$, having a thickness of 3 nm and emitting light in a range corresponding to green color. Then again the substrate is heated to 850° C. and TMG is introduced at 14 μmol/min. to grow barrier layer 4 of GaN.

The substrate then is cooled to 760° C., and trymethylindium (TMI) served as a source indium material and TMG are introduced at 6.5 (μmol/min.) and 2.8 (μmol/min.), respectively, to grow quantum well layer 3b formed of $In_{0.18}Ga_{0.82}N$, having a thickness of 4.5 nm and emitting light in a range corresponding to blue color. Then again the substrate is heated to 850° C. and TMG is introduced at 14 μmol/min. to grow barrier layer 4 of GaN.

Well and barrier layers are thus repeatedly grown to grow active layer 7 formed of a multi quantum well (MQW) formed of three pairs emitting light at different wavelengths, respectively. Since active layer has a plurality of well layers providing emission in red, blue and green, it is possible to obtain the device emitting white light with a single chip and emission can be controlled in tone. Note that with respect to the order of quantum well layers 3a, 3b, 3c there was not observed a difference in structural characteristics depending on their different compositions, thicknesses and emission wavelengths.

After active layer 7 has completely been grown, a technique similar to that described in the first embodiment is employed to grow a carrier block layer 5 of p-type formed of $Al_{0.20}Ga_{0.75}In_{0.05}N$ and having a thickness of 50 nm, grow a second clad layer 6 of p-type formed of $Ga_{0.9}In_{0.1}N$ and having a thickness of 100 nm, provide transparent electrode 17 on an upper surface of the second clad layer 6, and furthermore provide bonding electrode 16 on a portion thereof and electrode 15 on a lower surface of silicon substrate 1, and a dicing apparatus is further employed to divide the same into 300 μm×300 μm to complete the light emitting device of the second embodiment.

Third Embodiment

The present invention in a third embodiment will now be described. In the first and second embodiments a light emitting device structure is fabricated directly on the crystal in the form of a triangular prism 11 that is not a continuous film on a silicon substrate inclined relative to a (001) plane by 7.3°. A light emitting semiconductor device can also be fabricated after a GaN substrate formed of a continuous film 12 of crystals 11 combined together is provided, as shown in FIG. 9.

Figure 14:
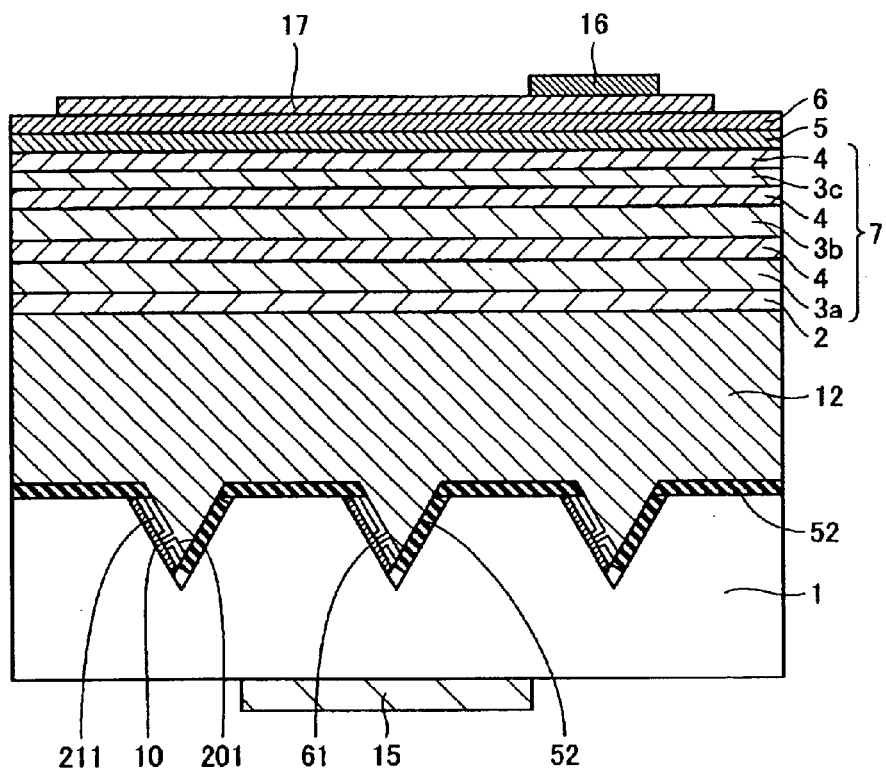
FIG. 14 is a cross section of a structure of a light emitting semiconductor device of a third embodiment.

FIG. 14 shows a light emitting device of the third embodiment. In the light emitting device of the third embodiment, as shown in the figure, on silicon substrate 1 continuous film 12 is provided and thereon active layer 7 is provided with the first clad layer 2 posed therebetween. Furthermore, silicon substrate 1 is overetched to provide an overetched portion 211 and on a groove, mask 52 protrudes. This protrusion of mask 52 prevents dislocation 201 from reaching a (1-101) facet corresponding to a growth surface of continuous film 12. Other than that, the light emitting device is similar to that of the second embodiment.

Note that while FIG. 14 shows a light emitting device structured to allow silicon substrate 1 to remain, a GaN substrate may be formed thick and silicon substrate 1 may be removed.

A method of fabricating the light emitting device of the third embodiment will now be described.

On silicon substrate 1 processed similarly as described in the first embodiment MOCVD is employed to grow an intermediate AlInN layer 10. A crystal of GaN is then grown on a (111) facet 61. Note that the nitride semiconductor grown herein is oriented to allow a <0001> direction to be perpendicular to an oblique plane. Furthermore the grown nitride semiconductor crystal has an upper surface with a GaN (1-101) facet 70 appearing substantially parallel to the substrate's main plane and when the growth is proceeding it forms a crystal in the form of a triangular prism 11 extending in the direction of the stripes. As the growth proceeds, crystal 11 increases in diameter and finally contacts an adjacent crystal in the form of the triangular prism 11. As the growth further continues, separate crystals 11 are combined together and, as shown in FIG. 9, a continuous, GaN crystal film 12 having at a surface thereof a flat GaN (1-101) facet is obtained.

Furthermore, a method described hereinafter may be employed to increase the GaN crystal in thickness and a light emitting semiconductor device may be fabricated thereon.

For example silicon substrate 1 is introduced into a hydride VPE (HVPE) apparatus. The temperature of the substrate is raised up to approximately 1050° C. while introducing $N_2$ carrier gas and $NH_3$, each at 5 l/min. Then, GaCl is introduced at 0.1 l/min. on the substrate to initiate growth of a GaN thick film.

GaCl is produced by conducting HCl gas to the Ga metal maintained at approximately 850° C. Also, by introducing impurity gas using an impurity doping line that is arranged individually to the proximity of the substrate, impurity can be doped arbitrarily during the growing step.

For the purpose of doping Si in the present embodiment, monosilane ($SiH_4$) is supplied 200 nmol/min. (Si impurity concentration: approximately $3.8\times10^{18}$ cm$^{-3}$) at the same time the growing step is initiated to form an Si doped GaN film.

The above-described growing step is carried out 8 hours to produce GaN having a total film thickness of approximately 350 μm on the Si substrate. Following the growing step, the Si substrate is removed by grinding or etching to obtain an extremely planar GaN substrate having a (1-101) plane. Thus in the present embodiment a GaN substrate having a (1-101) plane at the surface can be obtained.

While in the third embodiment a light emitting semiconductor structure including well layers having the same thickness and stacked, and providing emission in a single color may be adopted, as described in the first embodiment, a light emitting semiconductor structure providing emission in multiple colors may also be adopted, as described in the second embodiment. Hereinafter will be described a method of fabricating a light emitting semiconductor structure providing emission in multiple colors.

On continuous, GaN crystal film 12 as described above or a GaN substrate with silicon substrate 1 removed, once, at 1000° C., the first clad layer 2 formed of n-type GaN is stacked.

The first clad layer 2 may be formed of the same GaN as continuous GaN film 12 that contains In and does not contain Al, although using the first clad layer 2 formed of GaInN that contains In and does not contain Al would provide a lattice constant approaching that of active layer 7 and reduce dislocation to provide a semiconductor device providing emission highly efficiently.

Subsequently a technique similar to that employed in the second embodiment is employed to grow a quantum well layer 3 a formed of $In_{0.25}Ga_{0.75}N$ and having a thickness of 8 nm and providing emission in a range corresponding to red color, a well layer 3b formed of $In_{0.18}Ga_{0.82}N$ and having a thickness of 4.5 nm and providing emission in a range corresponding to green color, a well layer 3a formed of $In_{0.18}Ga_{0.82}N$ and having a thickness of 3 nm and providing emission in a range corresponding to blue color, a barrier layer 4 formed of GaN, a carrier block layer 5 of p-type $Al_{0.20}Ga_{0.75}In_{0.05}$ N and 50 nm in thickness, and the second clad layer 6 of p-type $Ga_{0.9}In_{0.1}N$ and 100 nm in thickness. A light emitting device structure is thus completely grown. Supplying TMG, TMI and $Cp_2Mg$ is then stopped and the temperature is lowered to room temperature and the structure is then output from the MOCVD apparatus.

Subsequently on an upper surface of the second clad layer 6 formed of a p-type $Ga_{0.9}In_{0.1}N$ layer a transparent electrode 17 is provided and on a portion thereof a bonding electrode 16 is provided, and on a lower surface of the GaN substrate an electrode 15 is provided. Furthermore a dicing apparatus is used to divide the intermediate product into 300 μm×300 μm to provide the light emitting device of the third embodiment shown in FIG. 14.

It should be noted, however, that, as has been described in the first embodiment, dislocation is introduced in a vicinity of an interface of silicon substrate and the nitride semiconductor film. To avoid this, when the substrate is etched to provide the silicon (111) facet 61 it is etched deeper by an amount corresponding to a region in which dislocation expands. This can provide over-etched portion 211, as shown in FIG. 14, to prevent dislocation 201 from penetrating continuous film 12 and reaching a surface thereof.

Fourth Embodiment

The present invention in a fourth embodiment will be described. In the present embodiment, as an exemplary application of the second embodiment, a crystal in the form of a triangular prism 11 underlies a light emitting semiconductor device in the form of a triangular prism 150 fabricated by crystal growth and having a well layer formed of multiple layers providing emission at different emission wavelengths such as the three primary colors of red, green and blue.

Figure 16:
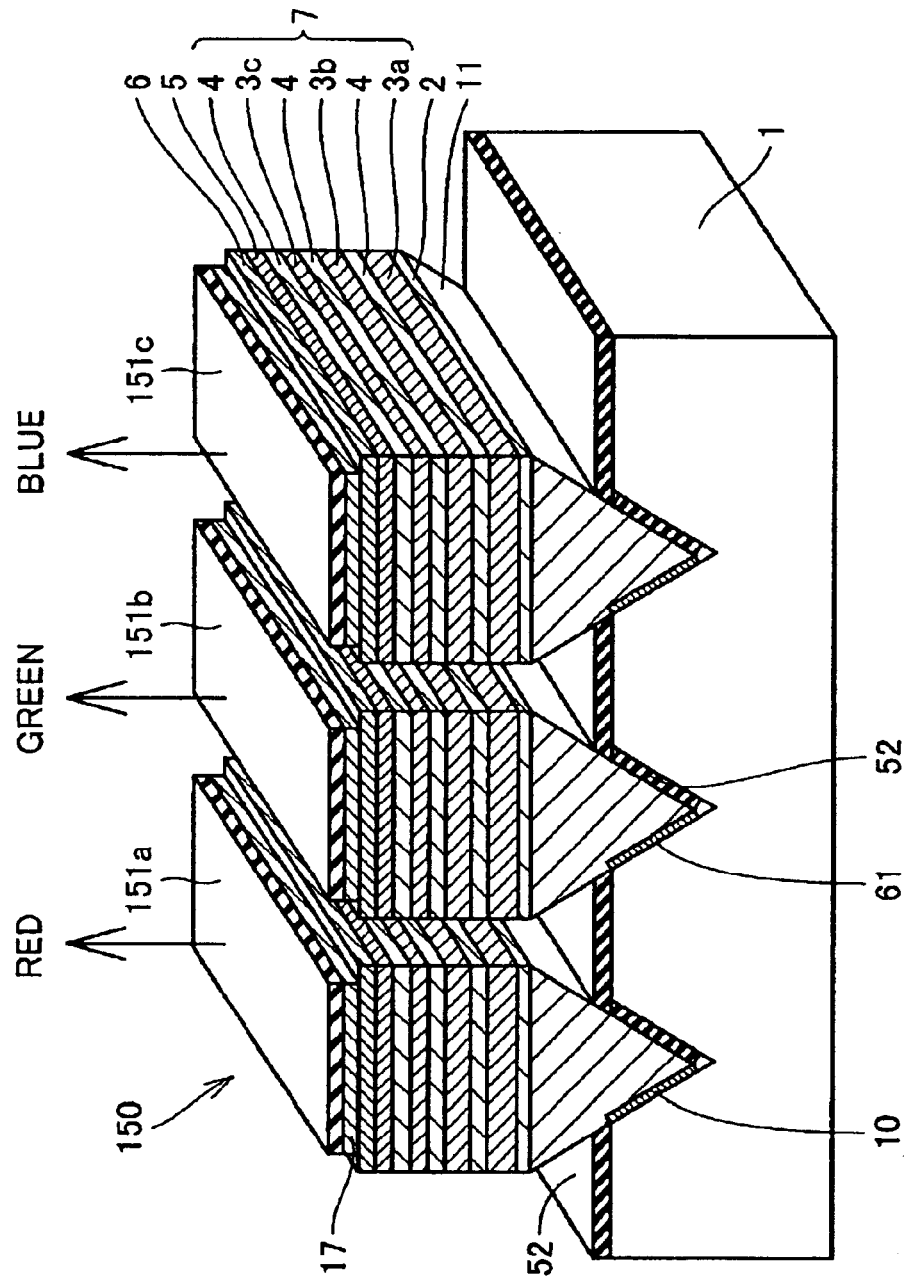
FIG. 16 is a cross section of a structure of a light emitting semiconductor device of a fourth embodiment.

More specifically, as shown in FIG. 16, individual light emitting semiconductor devices each in the form of a triangular prism 150 underlie a transparent electrode 17 and monocolor wavelength transparent films 151a, 151b, 151c stacked thereon. Transparent films 151a, 151b, 151c are formed for example of dielectric multilayer film selectively transmitting only a single color, i.e., an emission provided from well layer 7 of red, blue and green light emitting devices 150, respectively. Transparent films 151a, 151b, 151c are not limited to dielectric multilayer reflection film and may be liquid crystal or colored resin.

Furthermore on silicon substrate 1 more than one unit shown in FIG. 16 may be arranged and individually controlled to provide emission. For example, as shown in FIG. 17, a display integrating light emitting semiconductor devices having the form of a triangular prism can be fabricated.

In accordance with the present invention a compound semiconductor layer is grown on a plane inclined 63 degrees relative to a substrate's main plane or on a plane inclined relative to the inclined plane in any direction within three degrees to allow the compound semiconductor layer to include a well layer increased in thickness. This allows an emission wavelength to be controlled without reduced electron hole pair carrier recombination probabilities. Furthermore by stacking more than one well layer a multicolor light emitting device formed of a single chip can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting semiconductor device comprising a substrate and a compound semiconductor layer disposed on the substrate and represented by a general expression $In_xGa_yAl_zN$, wherein x+y+z=1, $0 \leq x \leq 1$, $0 \leq y \leq 1$, and $0 \leq z \leq 1$, characterized in that:

said substrate has a groove having an oblique plane corresponding to one of a plane inclined relative to a main plane of the substrate by 62 degrees and a plane inclined relative to the inclined plane in any direction within three degrees;

said compound semiconductor layer includes a base layer disposed on said oblique plane and an active layer disposed on the base layer; and said active layer is formed of a well layer and a barrier layer alternately stacked; said well layer having a thickness of 2 to 10 nm, wherein said active layer has more than one well layer different in thickness.

2. The light emitting semiconductor device of claim 1, wherein said active layer has a plurality of well layers providing emission in red, blue and green to allow emission in white with a single chip.

3. A light emitting semiconductor device comprising a substrate and a compound semiconductor layer disposed on the substrate and represented by a general expression $In_xGa_yAl_zN$, wherein x+y+z=1, $0 \leq x \leq 1$, $0 \leq y \leq 1$, and $0 \leq z \leq 1$, characterized in that:

said substrate has a groove having an oblique plane corresponding to one of a plane inclined relative to a main plane of the substrate by 62 degrees and a plane inclined relative to the inclined plane in any direction within three degrees;

said compound semiconductor layer includes a base layer disposed on said oblique plane and an active layer disposed on the base layer; and said active layer is formed of a well layer and a barrier layer alternately stacked, said well layer having a thickness of 2 to 10 nm, wherein:

on said oblique plane more than one said compound semiconductor layer are integrated;

said compound semiconductor layer individually includes an active layer having a well layer providing emission of a plurality of emission wavelengths; and said compound semiconductor layer underlies a transparent film.

4. The light emitting semiconductor device of claim 3, wherein said transparent film selectively transmits light emitted by said well layer and formed of spectra.

5. A light emitting semiconductor device comprising a substrate and a compound semiconductor layer disposed on the substrate and represented by a general expression $In_xGa_yAl_zN$, wherein x+y+z=1, $0 \leq x \leq 1$, $0 \leq y \leq 1$, and $0 \leq z \leq 1$, characterized in that:

said substrate has a groove having an oblique plane corresponding to one of a plane inclined relative to a main plane of the substrate by 62 degrees and a plane inclined relative to the inclined plane in any direction within three degrees;

said compound semiconductor layer includes a base layer disposed on said oblique plane and an active layer disposed on the base layer; and said active layer is stacked in a direction intersecting a direction of a c axis of said base layer, wherein said active layer has more than one well layer different in thickness.

6. The light emitting semiconductor device of claim 5, wherein said active layer has a plurality of well layers providing emission in red, blue and green to allow emission in white with a single chip.

7. A light emitting semiconductor device comprising a substrate and a compound semiconductor layer disposed on the substrate and represented by a general expression $In_xGa_yAl_zN$, wherein $x+y+z=1$, $0 \leq x \leq 1$, $0 \leq y \leq 1$, and $0 \leq z \leq 1$, characterized in that:

said substrate has a groove having an oblique plane corresponding to one of a plane inclined relative to a main plane of the substrate by 62 degrees and a plane inclined relative to the inclined plane in any direction within three degrees;

said compound semiconductor layer includes a base layer disposed on said oblique plane and an active layer disposed on the base layer; and said active layer is stacked in a direction intersecting a direction of a c axis of said base layer, wherein:

on said oblique plane more than one said compound semiconductor layer are integrated;

said compound semiconductor layer individually includes an active layer having a well layer providing emission of a plurality of emission wavelengths; and said compound semiconductor layer underlies a transparent film.

8. The light emitting semiconductor device of claim 7, wherein said transparent film selectively transmits light emitted by said well layer and formed of spectra.

* * * * *